United States Patent [19]

Taniguchi et al.

[11] 4,403,336
[45] Sep. 6, 1983

[54] X-RAY EXPOSURE APPARATUS

[75] Inventors: Motoya Taniguchi; Minoru Ikeda; Nobuyuki Akiyama, all of Yokohama, Japan

[73] Assignee: Hitachi, Ltd., Tokyo, Japan

[21] Appl. No.: 367,996

[22] Filed: Apr. 13, 1982

[30] Foreign Application Priority Data

Apr. 13, 1981 [JP] Japan ................................ 56-54429

[51] Int. Cl.³ ............................................ G03B 41/16
[52] U.S. Cl. .................................................. 378/035
[58] Field of Search ...................................... 378/34, 35

[56] References Cited

U.S. PATENT DOCUMENTS 4,119,855 10/1978 Bernacki ............................. 378/34
4,185,202 1/1980 Dean et al. ........................... 378/34

Primary Examiner—Davis L. Willis
Assistant Examiner—T. N. Grigsby
Attorney, Agent, or Firm—Antonelli, Terry & Wands

[57] ABSTRACT

An X-ray exposure apparatus making use of a soft X-ray. An atmospheric chamber charged with a gas having a high permeability to X-ray is disposed between the X-ray source and the mask having the pattern to be replicated, such that the mask is supported by the atmospheric chamber. A part or the whole of an alignment optical system is disposed in the atmospheric chamber. According to this arrangement, it is possible to decrease the rate of attenuation of the X-ray between the source and the mask to attain higher ratio of utilization of the generated X-ray, thereby to shorten the replicating time and to improve the through put (amount of replication per unit time).

5 Claims, 3 Drawing Figures

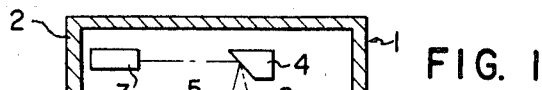
U.S. Patent    Sep. 6, 1983    4,403,336

X-RAY EXPOSURE APPARATUS

BACKGROUND OF THE INVENTION

The present invention relates to an apparatus for replicating a pattern of a mask onto a photoresist film formed on a wafer, in the production of integrated circuit. More particularly, the invention is concerned with an X-ray exposure apparatus adapted to replicate the mask pattern by means of X-ray.

The current tendency of large-scale integration of integrated circuit gives a rise to the demand for further refining of the pattern to be replicated on the wafer. To cope with this demand, a method called reduction projection exposure method, making use of ultraviolet rays or deep ultraviolet ray has been put into practical use. This method permits the refining of width and pitch of the pattern to an order of 2 to 3 $\mu$m.

For attaining a larger scale of integration, however, it is necessary to provide the line width of the pattern smaller than 1 $\mu$m. With the conventional exposure apparatus using light, however, it is very difficult to achieve the replication of minute pattern on the order of sub micron, because of various problems such as diffraction of light, multiple reflection in the optical system, interference of light and so forth.

Hitherto, an X-ray exposure apparatus has been proposed as an apparatus capable of replicating pattern on the order of sub micron using a soft X-ray of a wavelength ranging between 1 and 50 Å.

It is well known that, with this X-ray exposure apparatus, it is possible to effect a replication of a pattern at a high precision, because the diffraction and scattering due to contamination are avoided thanks to the use of the X-ray which has a wavelength much smaller than those of the conventionally used ultraviolet rays and super ultraviolet rays. Although some experimental X-ray exposure apparatus have been proposed up to now, none of them are still far from practical use.

One of these proposed X-ray exposure apparatus incorporates an X-ray generating means whole or a part thereof having an X-ray window is movable vertically, a mask having a predetermined pattern and disposed under the X-ray generating means, a table disposed under the mask and movable in three directions X, Y and Z, as well as in the rotational direction $\theta$, and a horizontally movable optical system disposed laterally of the X-ray generating means and adapted for obtaining an alignment between the mask and the wafer.

In this type of X-ray exposure apparatus, it is necessary that the X-ray window has a strength sufficiently to withstand a large force produced by the pressure differential between the atmospheric pressure and the high vacuum on the order of $10^{-6}$ Torr generated in the X-ray generating means. It is also necessary that the X-ray window has a size substantially equal to the area of the replication. Therefore, for effecting a replication in one time on a wafer of 3 inches dia., it is necessary that the X-ray window has a diameter of 3 inches. In this case, the beryllium constituting the X-ray window has a thickness of 50 $\mu$m at the smallest. The increased thickness of the beryllium in turn increases the rate of attenuation of the X-ray transmitted through the X-ray window. For instance, in the case of the X-ray of AlK$\alpha$ (wavelength 8Å), the X-ray is attenuated by 75% as it passes through the beryllium window of 50 $\mu$m thickness. A further increase of the replication area to be processed in one time requires an increase of the thickness of the X-ray window, which in turn increases the rate of attenuation of the X-ray undesirably.

Due to a mechanical restriction, a gap of several mm at the smallest is necessary between the X-ray window and the mask in the state of replication. This gap is filled with atmosphere (air) which also causes an attenuation of the X-ray. More specifically, a 20% attenuation of the X-ray is caused when the gap between the X-ray window and the mask is 2 mm.

Since the X-ray is attenuated largely by the gap between the X-ray window and the mask, only 20% or so of the X-ray generated by the X-ray generator is utilized on the upper surface of the mask. In consequence, the time required for the replication of the pattern is prolonged, resulting in a reduction of through put (number of replication cycle per unit time). Thus, this type of apparatus has only a small productivity and cannot be used as a practical equipment for the mass-production of the product.

SUMMARY OF THE INVENTION

Accordingly, an object of the invention is to provide an X-ray exposure apparatus suited for the mass-production of the product.

Another object of the invention is to provide an X-ray exposure apparatus in which the attenuation of the X-ray generated from the X-ray source is diminished to achieve a high through put.

Still another object of the invention is to provide an X-ray exposure apparatus improved to facilitate the handling of the wafer.

To these ends, according to the invention, there is provided an X-ray exposure apparatus having the following features. Namely, in the X-ray exposure apparatus of the invention, an atmospheric chamber containing a gas permeable to X-ray is disposed at the same side of the X-ray generating means as the X-ray window. Also, a mask having the desired pattern is directly fixed in such a manner as to cover an aperture formed in the wall of the atmospheric chamber opposing to the X-ray window. A part of an optical system for achieving alignment is disposed in the atmospheric chamber in such a manner as to be able to move between an alignment position and a stand-by position. A wafer is disposed at the outside of the atmospheric chamber so as to oppose to the mask, and is moved by a stage in the X, Y and Z directions, as well as in the rotational direction $\theta$. In operation, the mask pattern is replicated onto the wafer while the latter is placed in the atmosphere (air).

BRIEF DESCRIPTION OF THE DRAWINGS

FIG. 1 is a sectional front elevational view of an X-ray exposure apparatus in accordance with the present invention;

FIG. 2 is a sectional side elevational view of the apparatus shown in FIG. 1; and FIG. 3 is a sectional front elevational view of the apparatus shown in FIG. 1 in the state under the work for replacement of the mask.

DESCRIPTION OF THE PREFERRED EMBODIMENT

A preferred embodiment of the invention will be described hereinunder with reference to the accompanying drawings.

Referring to FIGS. 1 and 2 showing an X-ray exposure apparatus of the invention, an X-ray generating means 1 has a vacuum chamber 2 accomodating an electron gun 3 and a target 4. As the target 4 is hit by the electron beam oscillated from the electron gun 3, the target 4 generates an X-ray of the kind corresponding to the material of the target 4. The X-ray is taken out through an X-ray window 6 which covers an opening 5 formed in the chamber 2.

The space formed by the chamber 2 and the X-ray window 6 is maintained under a high vacuum of $10^{-6}$ Torr or more. An atmospheric chamber 8 is provided at its upper end with an opening 7 opposing to the X-ray window 6. The atmospheric chamber 8 is connected in an airtight manner to the chamber 2 by means of a bellows 9 arranged to surround the X-ray window 6 and the opening 7. An opening 10 formed in the lower surface of the atmospheric chamber 8 is surrounded by a groove 11 in which formed are a plurality of small apertures 12 connected to a vacuum source which is not shown.

A mask 15 has a substrate 13 made of a material permeable to X-ray such as $SiO_2$, $Al_2O_3$ or the like and a desired pattern 14 formed on the substrate 13 with a material which absorbs the X-ray, e.g. Au. The mask 15 detachably fits in the groove 11 and is held by the sucking force of the vacuum transmitted through the small apertures 12 mentioned before. In this state, the juncture between the atmospheric chamber 8 and the mask 15 forms an airtight seal. A groove 16 extending from the outside of the atmospheric chamber 8 across the opening 10 is formed above the opening 10. Also, a plurality of grooves for receiving "O" rings 17 are disposed to oppose to each other across the groove 16. The groove 16 is slidably penetrated by a shutter 18 so as to be opened and closed by the latter. An airtight seal is formed by the "O" ring 17 between the shutter 18 and the atmospheric chamber 8. A hole 20 connected to a source 19 of helium gas and a hole 22 connected to an evacuating means 21 open in the space defined by the shutter 18 and the mask 15. These holes are intended for effecting a substitution of gas in the space surrounded by the mask 15 and the shutter 18 when the mask 15 is replaced. A bracket 23 is fixed to the inside of the atmospheric chamber 8. A pair of linear guides 24 for forward movement are fixed to the bracket 23 in such a manner as to oppose each other at a suitable distance from each other. A female screw is formed on the rear end of a first slider 25 slidably guided by the linear guides 24, and is engaged by a feed screw 26. The feed screw 26 penetrates the atmospheric chamber 8 rotatably and in an airtight manner, and is coupled to a motor 27 fixed to the outer side of the atmospheric chamber 8.

Accordingly the slider 25 is adapted to slide back and forth along the linear guides 24 as the motor 27 operates. A linear guide 28 is formed on the front surface of the slider 25 and slidably guides a second slider 29 which is provided at its side surface with a rack 30. The rack 30 meshes with a pinion 32 coupled to the shaft of a motor 31 supported by the slider 25. In consequency, the slider 29 is moved up and down as the motor 31 operates. The slider 29 is provided with a pair of objective lenses 33 corresponding to alignment marks formed on the mask 15. A reflecting mirror 34 is mounted on the objective lens 33. A half mirror 35 is disposed in the atmospheric chamber 8 so as to oppose to each reflective mirror 34. Windows 36 and 37 are formed in the wall of the atmospheric chamber 8 so as to correspond to the half mirrors 35. Illumination lamp 38 are disposed above the window 36 while position sensors 39 are disposed at the outside of the window 37. As the illumination lamps 38 lit on, the light beams emitted from the latter are reflected by the half mirrors 35 towards the reflective mirrors 34 and, after reflection by the latter, applied to the alignment marks on the mask 15 through the objective lenses 33. The light beams transmitted through the alignment marks are reflected by a latermentioned wafer and are gathered by the objective lenses 33 so as to be reflected by the reflective mirrors 34. The light beams are then transmitted through the half mirrors 35 and then through the windows 37, so as to be received by the position sensors 39. The objectives lenses 33 are adapted to be reciprocatingly moved by the operation of motors 27 and 31 between the alignment position opposing to the alignment marks and a stand-by position out of the path of the X-ray during the replication. The objective lenses 33, reflective mirrors 34, half mirrors 35, lamps 38 and the position sensors 39 in combination constitute alignment optical systems. A diaphragm 40 is provided at a portion of the atmospheric chamber 8, so as to avoid any deformation or deflection of the mask 15 which may, for otherwise, be caused by the movement of the helium gas in the atmospheric chamber 8 and the fluctuation of pressures at the inside and outside of the same. The diaphragm 40 is formed of a high molecule compound such as synthetic resin, rubber or the like. The atmospheric chamber 8 is charged with helium gas to the same pressure as the external pressure. A resist 43 is uniformly applied on a substrate 42 to form a wafer 41. The wafer 41 is placed on an alignment stage 44 which is movable finely and coarsely in three directions X, Y and Z, as well as in the rotational direction $\theta$. Alignment marks corresponding to those of the mask 15 are formed on the surface of the wafer 41. The alignment stage 44 may be constructed so as to be able to move reprocatingly between a position for supplying and taking out the wafer 41 and a replicating position below the mask 15.

In operation, the wafer 41 is mounted on a predetermined position on the alignment stage 44 while the latter is stationed at the wafer supplying position. Then, the alignment stage 44 is moved to the replicating position below the mask 15. On the other hand, the motor 27 is started to advance the slider 25 to a predetermined position and, thereafter, the motor 31 is started to lower the slider 29, thereby to focus the objective lenses 33 on the alignment marks on the mask 15. After the illumination lamps 38 are lit on and the light beams are applied to the alignment mark, the position of the alignment mark on the mark 15 is sensed by the position sensors 39 receiving the light beams reflected by the alignment mark and is memorized. Thereafter, the motor 31 is started to lower the slider 29 further, thereby to focus the objective lenses 33 the alignment mark on the wafer 41. Then, the positions of the alignment marks on the wafer 41 is sensed by the position sensors 39 and are compared with the positions of the alignment marks on the mask 15. The amount of correction of position of the wafer 41 is determined through this comparison and an instruction is given for correcting the position of the alignment stage 44. In accordance with this instruction, the alignment stage 44 moves the wafer 41 in the X and Y directions, as well as in the rotational direction $\theta$, to correctly locate the wafer 41 in the horizontal plane. After this horizontal locating operation, the alignment stage 44 is moved upward to set the gap between the mask 15 and the wafer 41 on an order of several to ten and several μm. After the locating of the mask 15 and the wafer 41, the motor 31 operates to lift the slider 29 and, thereafter, the motor 27 operates to retract the slider 25 to move the objective lenses 33 aback to the stand-by position. The electron gun 3 is operated in this state to generate the X-ray to replicate the pattern on the mask 15 onto the wafer 41. The X-ray generated from the target 4 reaches the wafer 41 through the X-ray window 6, helium gas in the atmospheric chamber 8, mask 15 and the air layer between the mask 15 and the wafer 41. The X-ray window 6 is disposed in the vicinity of the target 4 so that the size thereof can be decreased largely in relation to the size of the wafer 41 to which the pattern is replicated. This in turn permits the thickness of the X-ray window to the processing limit of the material constituting the X-ray window. Assuming here that the X-ray window 6 has a thickness of 25 μm and a diameter of 25 mm, the rate of attenuation of the X-ray is about 50%. Also, the rate of attenuation of X-ray by the helium in the gap between the X-ray window 6 and the mask 15 is about 10%, if the size of the gap is 250 mm. In consequence, the mask 15 can receive about 45% of the X-ray generated from the target 4.

After application of the X-ray over a predetermined period of replicate the pattern 14 of the mask 15 onto the resist film 43 of the wafer 41, the electron gun 3 stops to operate thereby to complete the replicating operation. Then, the alignment stage 44 is operated to lower the wafer 41 and is returned to the supplying position where the wafer 41 is taken out of the exposure apparatus. This operation is conducted repeatedly to effect the replication on successive wafers.

When the mask 15 is to be replaced with another one for replicating a different pattern, the shutter 18 is pushed forward to intercept the path of the X-ray thereby to disconnect the hole 10 from the atmospheric chamber 8. Then, the small apertures 12 are disconnected from the vacuum source and are brought into communication with the atmosphere to release the mask 15. Then, the mask 15 is taken out of the groove 11 and a new mask 15 is inserted into the groove 11. Then, the small apertures 12 are brought again into communication with the vacuum source so that the mask 15 is sucked by the force of vacuum transmitted through the small apertures 12, to form a sealed space by a cooperation of the mask 15, hole 10 and the shutter 18. This sealed space is filled with a mixture of air and the helium gas because the air is introduced into this space during the exchange of the mask 15. Then, the evacuation means 21 is started to induce the gas from the sealed space and the helium gas is charged into the evacuated space from the source 19 of the helium gas. Then, the shutter 18 is extracted to bring the hole 10 into communication with the atmospheric chamber 8, thus completing the replacement of the mask 15. This mask renewal method can minimize the consumption of helium gas advantageously.

In the embodiment described heretofore, the pattern is replicated onto the entire surface of the water 41 by a single replicating action. This, however, is not exclusive and the invention can be applied to the replication of the pattern for each chip of the integrated circuit. When the replication is made for each chip, it is possible to avoid the undesirable deterioration of the replication accuracy attributable to the divergence of the X-ray, although the efficiency of the work is lowered. Provided that there is a sufficient marging between the alignment mark of the wafer and the range of the pattern replication, it is not necessary to retract the objective lenses to the stand-by position during the replication.

Generally, aluminum (Al), silicon (Si) and palladium (Pb) are used as the material of the target 4 for generating the X-ray. With these target materials, it is possible to obtain X-rays of wavelengths ranging between 4 and 8 Å.

It is a known measure to shape the target in a disc-like form and to rotate the same at a high speed while circulating cooling water therethrough, for making the X-ray generating means generate a strong X-ray. In such an X-ray generating means, the generating means as a whole is vibrated by the rotation of the target. Therefore, the X-ray generating means is connected to the atmospheric chamber 8 by means of a bellows 9, so that the vibration may be absorbed by the bellows 9. In the case where the target 4 is kept stationary as in the embodiment shown in FIGS. 1 and 2, the X-ray generating means may be rigidly connected to the atmospheric chamber 8 without using any bellows therebetween.

Known alignment means as those use in ordinary exposure apparatus can be used for obtaining alignment between the mask 15 and the wafer 41. Although in the illustrated embodiment only a portion of the alignment optical system is disposed in the atmospheric chamber 8, it is possible to dispose the entire part of the alignment optical system in the atmospheric chamber 8.

The mounting position for the shutter 18 is selected to be as close as possible to the mask 15 without hindering the formation of the small apertures 12 and the ventilation holes 20, 22 in the wall of the atmospheric chamber 8.

It is also possible to effect the aligning operation after setting the gap between the mask 15 and the wafer 41 for the replication. To this end, it is suggested to use, as the alignment optical system for obtaining alignment between the mask 15 and the wafer 41, a dual focus system in which, by using a reflective mirror or a combination of a reflective mirror and a prism, the path of light for illuminating the mask and the path of light for illuminating the wafer are made to have lengths different from each other to differentiate the focal positions of both lights.

What is claimed is:

1. An x-ray exposure apparatus for replicating a pattern formed in a mask onto a wafer using a soft X-ray, characterized by comprising:
    an X-ray generating means having an X-ray window and adapted to emit an X-ray through said X-ray window;
    an atmospheric chamber having holes formed in the surface thereof connected to said X-ray generating means and in the surface opposing to said surface, said atmospheric chamber being charged with a gas having a high permeability to X-ray;
    a mask attached to said atmospheric chamber in such a manner as to seal in an airtight manner the X-ray emitting hole of said atmospheric chamber; and
    an alignment means including an alignment state adapted to locate said wafer at a position opposing to said mask attached to said atmospheric chamber, said alignment means further including an alignment optical system at least an objective lens of which being disposed in said atmospheric chamber.

2. An X-ray exposure apparatus as claimed in claim 1, characterized by further comprising: a shutter disposed for opening and closing action and disposed at the inner side of the mask mounting position and in the vicinity of said mask; and a ventilation means connected, when said shutter is closed, between said shutter and a sealed space defined by said mask and said atmospheric chamber, thereby to effect the substitution of the gas in said sealed space.

3. An X-ray exposure apparatus as claimed in claim 1, characterized in that a portion of said atmospheric chamber includes a diaphragm.

4. An X-ray exposure apparatus as claimed in claim 1, wherein, among the constituents of said alignment optical system disposed in said atmospheric chamber, at least said objective lens is movable in either one or both of the vertical and horizontal directions by moving means disposed in said atmospheric chamber.

5. An X-ray exposure apparatus as claimed in claim 1, wherein said X-ray generating means includes means for rotating said target at a high speed and means for cooling said target from the inner side thereof, and wherein said X-ray generating means and said atmospheric chamber are connected to each other by means of a bellows.

* * * * *